(12) United States Patent
Varnica et al.

(10) Patent No.: US 8,935,600 B1
(45) Date of Patent: Jan. 13, 2015

(54) MODIFICATION OF DECODER OPERATING MODE BASED ON A PROBABILITY OF NON-STANDARD ERRORS IN CONCATENATED DECODING SYSTEMS

(71) Applicant: Marvell International Ltd., Hamilton (BM)

(72) Inventors: Nedeljko Varnica, San Jose, CA (US); Panu Chaichanavong, Sunnyvale, CA (US); Heng Tang, San Jose, CA (US); Gregory Burd, San Jose, CA (US)

(73) Assignee: Marvell International Ltd. (BM)

( * ) Notice: Subject to any disclaimer, the term of this patent is extended or adjusted under 35 U.S.C. 154(b) by 161 days.

(21) Appl. No.: 13/628,420

(22) Filed: Sep. 27, 2012

Related U.S. Application Data (60) Provisional application No. 61/540,127, filed on Sep. 28, 2011.

(51) Int. Cl.
*H03M 13/03* (2006.01)
*H03M 13/00* (2006.01)

(52) U.S. Cl.
USPC ............ 714/794; 714/759; 714/790; 714/795

(58) Field of Classification Search
None
See application file for complete search history.

(56) References Cited

U.S. PATENT DOCUMENTS

| | | | |
|---|---|---|---|
| 6,473,010 B1 * | 10/2002 | Vityaev et al. | 341/107 |
| 7,757,150 B2 * | 7/2010 | Stolpman | 714/752 |
| 8,051,363 B1 * | 11/2011 | Liu | 714/780 |
| 8,082,478 B2 * | 12/2011 | Lunglmayr et al. | 714/748 |
| 8,665,650 B2 * | 3/2014 | Yang | 365/185.2 |
| 2007/0283227 A1 * | 12/2007 | Sharon et al. | 714/776 |
| 2008/0010581 A1 * | 1/2008 | Alrod et al. | 714/763 |
| 2008/0316069 A1 * | 12/2008 | Draper et al. | 341/51 |
| 2009/0158114 A1 * | 6/2009 | Shokrollahi | 714/752 |
| 2009/0319861 A1 * | 12/2009 | Sharon et al. | 714/752 |
| 2014/0089759 A1 * | 3/2014 | Draper et al. | 714/766 |

* cited by examiner

*Primary Examiner* — Daniel McMahon (57) ABSTRACT

In one embodiment a data decoding apparatus includes first and second decoding blocks configured to decode codeword bits in a first mode determined by a first probability of non-standard errors and a second mode determined by a second probability of non-standard errors. The apparatus also includes a mode modification logic configured to cause at least one of the first and second decoding blocks to operate in the second mode when the first and second decoding blocks fail to decode the codeword bits in the first mode. In another embodiment, a method includes decoding codeword bits in a first mode determined by a first probability of non-standard errors. When decoding the codeword bits in the first mode fails to decode the codeword bits, the codeword bits are decoded in a second mode determined by a second probability of non-standard errors.

16 Claims, 6 Drawing Sheets

MODIFICATION OF DECODER OPERATING MODE BASED ON A PROBABILITY OF NON-STANDARD ERRORS IN CONCATENATED DECODING SYSTEMS

CROSS REFERENCE TO RELATED APPLICATIONS

This patent disclosure claims the benefit of U.S. Provisional Application No. 61/540,127 filed on Sep. 28, 2011 which is hereby wholly incorporated by reference in its entirety.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Many data storage systems (e.g., disk drives) employ some type of coding system in which data being stored is combined, or encoded, with redundant information to form a codeword that meets a priori established constraints. Codewords that are received or retrieved from memories (e.g., read from a hard disk drive sector) are checked against the constraints to determine if the codeword has been correctly read. If the codeword does not meet the constraints, several techniques may be used to attempt to correct the codeword. One popular technique is to use codes that are amenable to iterative decoding approaches, and correct the codeword via iterative decoding techniques.

SUMMARY

In one embodiment an apparatus includes first and second decoding blocks configured to decode codeword bits in a first mode determined by a first probability of non-standard errors and a second mode determined by a second probability of non-standard errors. The apparatus also includes a mode modification logic configured to cause at least one of the first and second decoding blocks to operate in the second mode when the first and second decoding blocks fail to decode the codeword bits in the first mode.

In another embodiment, a method includes decoding codeword bits in a first mode determined by a first probability of non-standard errors. When decoding the codeword bits in the first mode fails to decode the codeword bits, the codeword bits are decoded in a second mode determined by a second probability of non-standard errors.

In another embodiment, a device includes a memory device configured to store data encoded as codeword bits and a decoder in communication with the memory device. The decoder includes a channel detector, an inner decoder, and a mode modification logic. The channel detector is configured to operate in a first mode determined by a first probability of non-standard errors to read a codeword bits from the memory device, to calculate first soft information based, at least in part on the first probability of non-standard errors, and to output the soft information. The inner decoder is configured to operate in a first mode determined by the first probability of non-standard errors to input the first soft information from the channel detector, to calculate second soft information based, at least in part on the first probability of non-standard errors, and to output the second soft information to specify probable values for codeword bits. The mode modification logic is configured to cause one or both of the channel detector and the inner decoder to operate in a second mode in which soft information is calculated based, at least in part, on a second probability of non-standard errors when the decoder fails to decode the codeword bits in the first mode.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
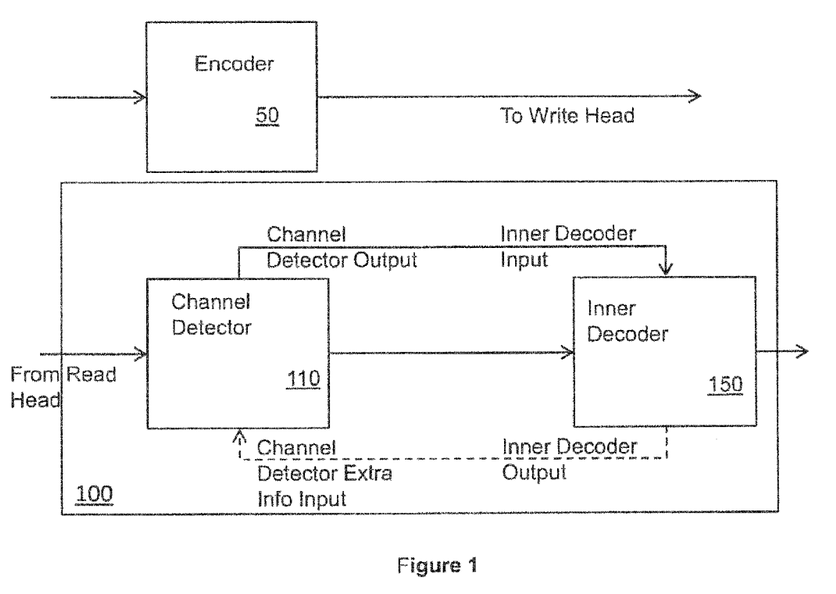
FIG. 1 illustrates one example of a concatenated decoding system.

FIG. 1 illustrates an example of a coding system that includes an encoder 50 and a decoding system 100. The coding system encodes user data with the encoder 50 to form one or more codewords. The codewords are sent to a write head that writes the codeword to physical memory. The decoding system 100 is a concatenated decoder that includes a channel detector 110 and an inner decoder 150. While a channel detector 110 and an inner decoder 150 are shown in FIG. 1, any type of decoding blocks may be used in the concatenated decoding system 100. The concatenated decoding system 100 receives a digital signal from a read head and processes the signal to output decoded user data.

The channel detector 110 and/or the inner decoder 150 calculate "soft information" about values of bits in a codeword. The soft information communicates a likely value of a bit as well as a confidence or likelihood that the value is correct. One example of soft information is a Log-Likelihood Ratio (LLR). The LLR for a given bit is a log of a ratio of a probability that the bit is zero divided by a probability that the bit is one. If the LLR is negative, the bit is more likely a one and if the LLR is positive, the bit is more likely a zero. The greater a magnitude of the LLR, the more confidence is associated with its polarity.

Soft information is calculated based on some assumptions about a probability of standard or typical errors in the codeword. The probability of standard errors is a factor in determining the LLR. The standard error types occur in each codeword and standard detectors may be tailored toward such error types. However, for a variety of reasons, certain non-standard error types may not be included in the determination of LLRs. The non-standard error types may occur only in certain codewords. Such errors should be factored into the determination of LLRs and the decoding operation. In general, a standard decoder operates in a mode that is determined, at least in part, by some assumption about the standard errors, but it may not consider non-standard errors.

Often, the probability of non-standard errors is assumed to be unknown, and the channel detector 110 and inner decoder 150 decode the codeword in a mode that reflects an assumption of an unknown probability of non-standard errors. In some systems, the probability of non-standard errors can be known by virtue of past system performance. For example, if it is known that a certain hard drive is damaged, a higher probability of non-standard errors may be assumed such that LLRs are initially lower in magnitude. The channel detector 110 and the inner decoder 150 then decode the codeword in a mode that reflects a known probability of non-standard errors.

The soft information from the channel detector 110 is fed to the inner decoder 150. The inner decoder 150 processes the soft information from the channel detector 110 to attempt to decode the codeword. In coding systems with intrinsic channel memory, the soft information from the inner decoder 150 is fed back to the channel detector 110 and the decoding process continues until a convergence is detected, or until the LLRs reach a threshold level of confidence, or until a predetermined number of iterations has been performed, or until a new codeword is received for decoding.

The channel detector 110 may be a Soft-Output-Viterbi-Algorithm (SOVA) detector, a BCJR detector, or any of a number of soft channel detectors. The inner decoder 150 may be any type of soft decoder, such as a Low Density Parity Check Code (LDPC) decoder. Examples of systems with intrinsic channel memory are data storage systems (e.g., hard drives). These systems model the channel between read/write heads acting on the data. Another example of systems with intrinsic channel memory are wireless channels used in modeling the physical channel between transmitter and receiver in the communications over wireless links.

In data storage systems (e.g., hard disk drives, solid state devices) hard errors and severe errors cause unique difficulties in decoding operations. A hard error is an error that occurs in writing in which a bit is written with the wrong polarity. Since it was encoded with the wrong polarity, the wrongly written bit will detect with a high confidence with a wrong polarity. Hard errors may be caused by defects in the storage media or by the writing process. A severe error is an error that occurs during reading in which a bit is detected as having the wrong polarity with high confidence. Severe errors may be caused by misalignment between a read head and a given sector or by physical defect phenomena on the device/media.

Hard errors and severe errors are difficult to compensate for because the bits involved may detect with a high confidence in the wrong polarity. This means the LLRs associated with the bits may have a large magnitude in the wrong polarity which may not converge to a correct polarity in normal decoding mode, or even in a retry mode. In addition, hard errors and severe errors are usually fairly isolated in localized portions (e.g., sectors) of storage media. Thus, it is not practical to apply assumptions that estimate probabilities of non-standard error associated with hard errors and severe errors across an entire storage device.

Described herein are systems, methods, and other embodiments associated with modifying a detector's operating mode based on a probability of non-standard errors in concatenated decoding systems, where the probability of errors may be an estimate. In typical concatenated decoding systems, such as the system 100 of FIG. 1, the channel detector 110 and inner decoder 150 function in a mode that may be determined by no assumption about the non-standard errors or by some partial assumption about the probability of non-standard errors in the encoded codewords (e.g., unknown probability of non-standard errors, historical probability of non-standard errors). When a codeword fails to decode, the decoders operate in a retry mode and the decoding may reflect different assumptions about the probability of non-standard errors.

The systems, methods, and other embodiments described herein modify, in retry mode, an operating mode of the channel detector 110 and/or the inner decoder 150 to reflect some probability of non-standard errors. The probability of non-standard errors used in retry mode is different from the probability of non-standard errors that determine the normal mode of operation of the channel detector 110 and/or the inner decoder 150 in the prior failed decoding operation. The probability of non-standard errors may be estimated on a possible, as yet undetected, type of defect in the encoding or reading of the codeword (e.g., hard errors, severe errors). Different estimated probabilities associated with different types of defects may be used during retry, as will be described in more detail below.

Figure 2:
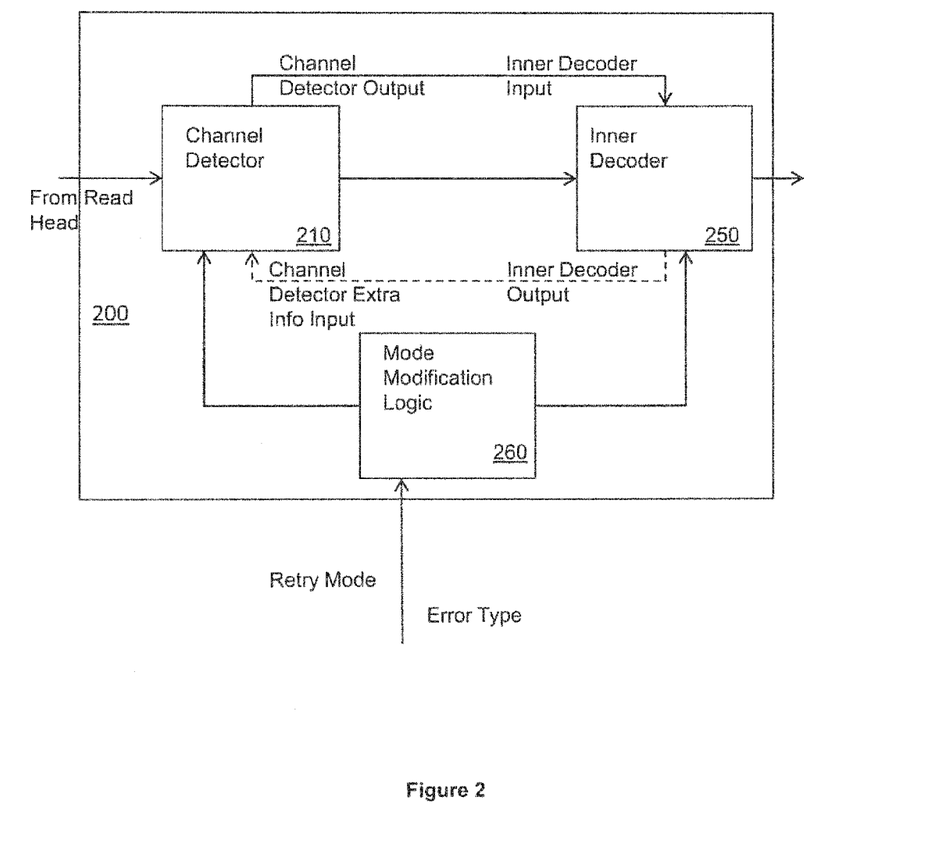
FIG. 2 illustrates one embodiment of an apparatus associated with modifying detector operating mode based on a probability of non-standard errors in concatenated decoding systems.

With reference to FIG. 2, one embodiment of a decoding system 200 is shown that is associated with modifying decoder operating mode based on a probability of non-standard errors. The decoding system 200 includes a channel detector 210 that receives a digital signal corresponding to codeword bits read from memory and transmitted by way of a channel to the channel detector 210. In one embodiment, the channel detector is a Soft Output Viterbi Algorithm (SOVA) channel detector that equalizes the input digital signal and outputs soft information about the likely values of the codeword bits.

The output (e.g., soft information) from the channel detector 210 is input to an inner decoder 250. The inner decoder 250 may be a low density parity check (LDPC) decoder. The output (e.g., soft information) of the inner decoder 250 may be fed back to the channel detector 210. The inner decoder 250 performs decoding operations on the output of the channel detector and determines if a valid codeword has been detected. If a valid codeword has been detected, the inner decoder 250 outputs the codeword. If a valid codeword has not been detected, the inner decoder output (e.g., soft information) may be input to the channel detector 210 as additional information the channel detector may use in a next round of processing of the codeword bits. This iterative process occurs, with an exchange of soft information between the channel detector and the inner decoder until a valid codeword is detected or the decoding operation fails (e.g., reaches a predetermined number of iterations or times out). When "normal" decoding operation fails, the decoding system 200 enters a retry mode in which additional decoding iterations may be performed.

As discussed above, the channel detector 210 and the inner decoder 250 decode bits (e.g., calculate soft information) based, in part, on some underlying assumption about the probability of non-standard errors in the codeword bits. The decoding system 200 includes a mode modification logic 260 that is configured to change an operating mode of the channel detector and/or the inner decoder into a second mode (different from a first mode used during normal decoding) during the retry mode. The second mode of operation is based on some probability of non-standard errors that is associated with a particular type of error that may be present, but has not yet been detected. For example, the probability of non-standard error may correspond to an estimated probability of non-standard error usually associated with a hard error, a severe error, or some other type of error.

The mode modification logic 260 may receive an input that specifies a type of error upon which to select a second mode or operation for the channel detector 210 and/or the inner decoder 250. The type of error selected may depend on which memory sector is being read. For example, if it is suspected that errors occurred during a write operation to a particular sector, when normal decoding fails on a codeword from the sector the mode modification logic 250 can modify the operation of the channel detector 210 and/or the inner decoder 250 to operation in a second mode that is based on a probability of non-standard errors associated with the presence of hard errors.

One way in which operation of a channel detector or decoder may be dependent on a given probability of non-standard errors is in calculation of soft information, such as LLRs. In the iterative decoding process, some initial values for LLRs are established based on an estimated probability of non-standard errors. The initial LLR values correspond to a baseline estimation of the probability of non-standard errors in the writing and reading process with respect to the media being read. Often, the probability of non-standard errors is unknown and is estimated to be zero or fairly low. Bits resulting from hard or severe errors detect with a high confidence, meaning that LLRs associated with those bits will have a wrong polarity with a high magnitude. Normal decoding operations will have difficulty recovering from these high LLR magnitudes that were based on a low estimated probability of non-standard errors. Even additional iterations in retry mode may not be sufficient to successfully decode a codeword that includes hard or severe errors.

Figure 3:
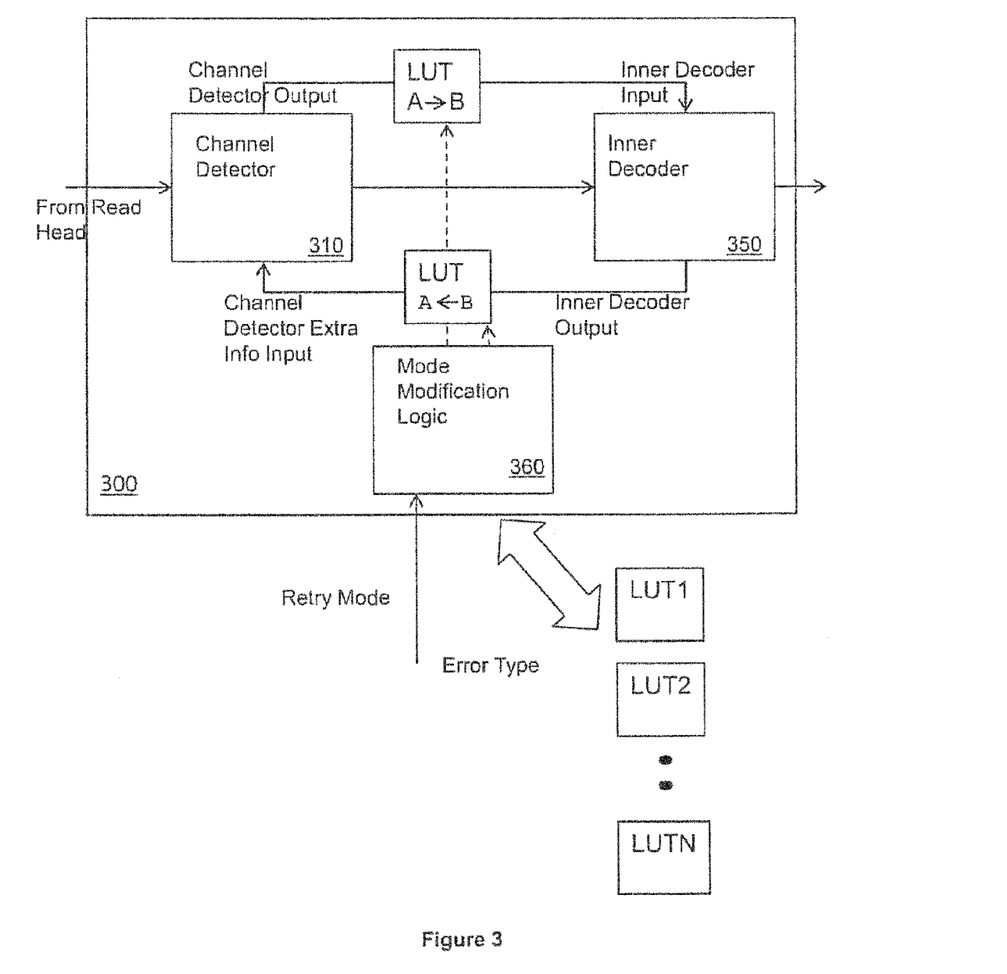
FIG. 3 illustrates one embodiment of an apparatus associated with modifying detector operating mode based on an estimated probability of non-standard errors in concatenated decoding systems.
Figure 4:
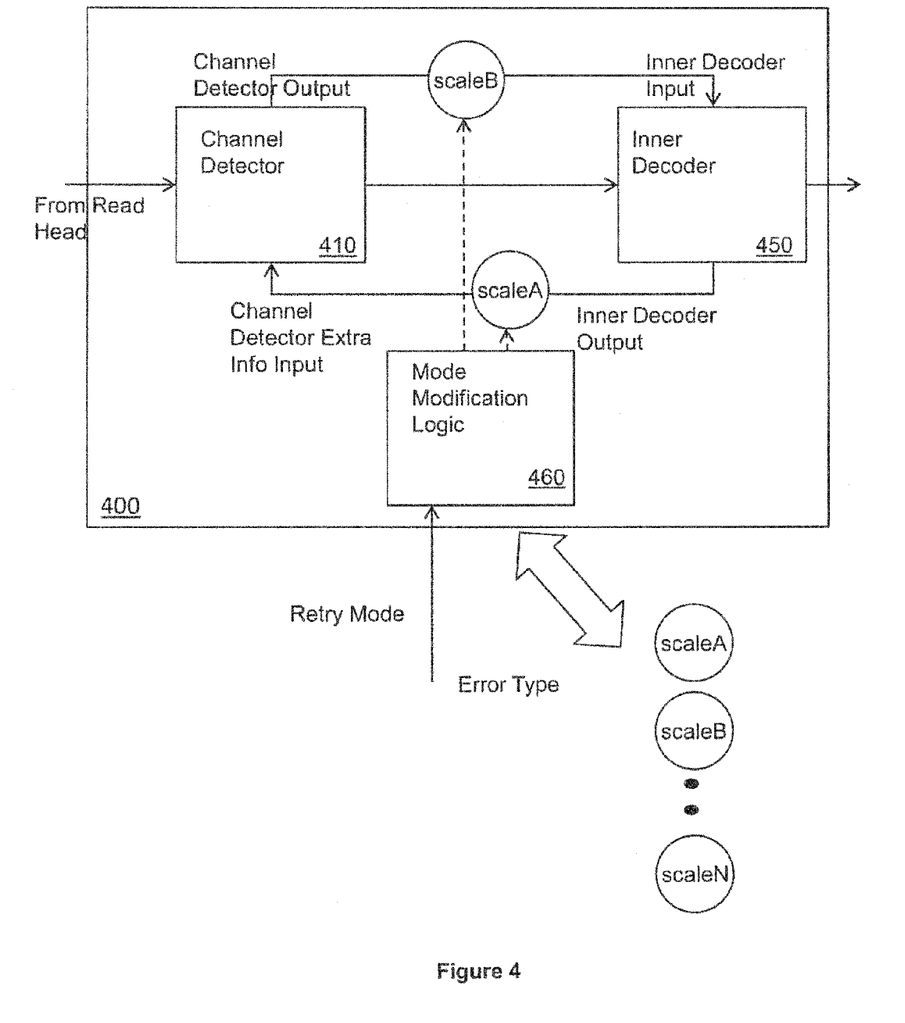
FIG. 4 illustrates one embodiment of an apparatus associated with modifying detector operating mode based on an estimated probability of non-standard errors in concatenated decoding systems.
Figure 5:
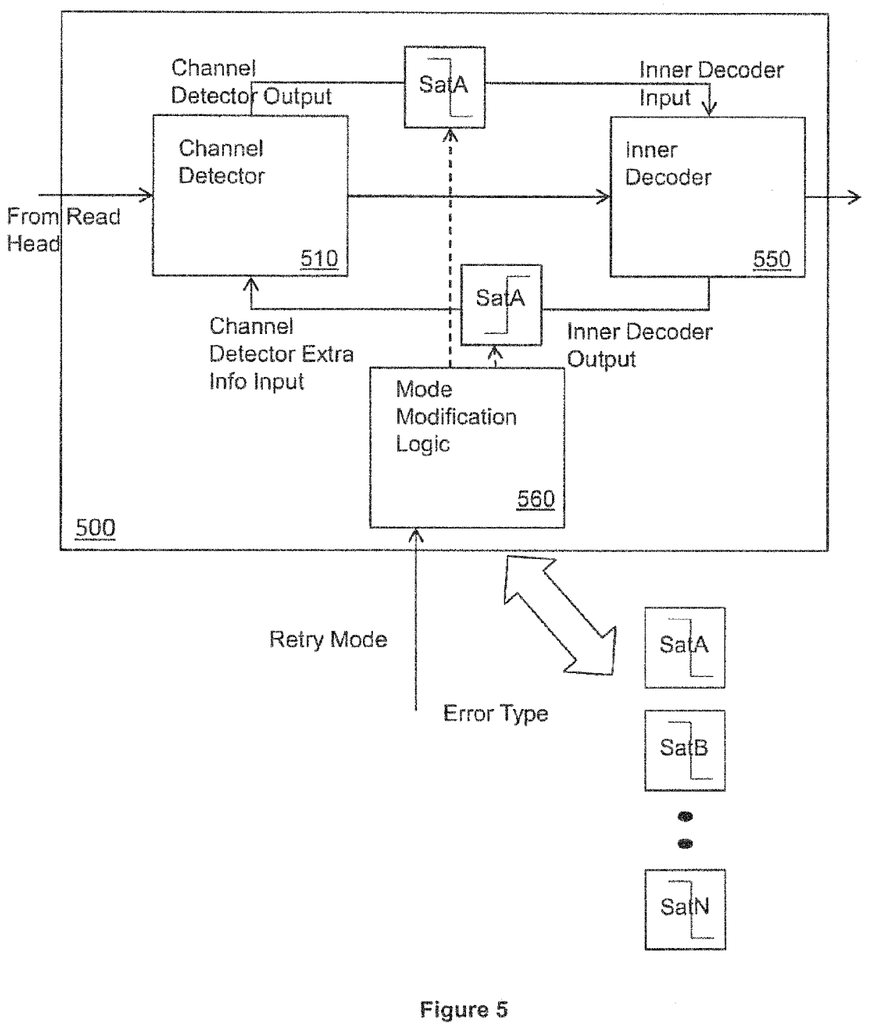
FIG. 5 illustrates one embodiment of an apparatus associated with modifying detector operating mode based on an estimated probability of non-standard errors in concatenated decoding systems.

The mode modification logic 250 causes the channel detector 210 and/or the inner decoder 250 to operate based on a relatively high estimated probability of non-standard errors in retry mode, even if there is no a priori knowledge that indicates that there is a high probability of non-standard errors. Thus, in one embodiment, LLR magnitudes in the second mode will be initially lower, changing the operation of the decoding processing significantly. This may allow the decoding system 200 to successfully decode a codeword with hard or severe errors in a limited number of iterations. FIGS. 3-5 illustrate various embodiments in which the mode modification logic changes LLR values based on some estimated probability of non-standard errors that is associated with some type of error.

If decoding using the estimated probability of non-standard errors is unsuccessful, the estimated probability of non-standard errors may be incremented and the channel detector 210 and/or inner decoder 250 may operate in a mode determined by the incremented probability of non-standard errors. The probability may continue to be incremented until decoding is successful or some other criteria is met. The estimated probability of non-standard errors may be incrementally increased or decreased through a predetermined range until successful decoding occurs or all values of probability are exhausted.

In one embodiment in which the inner decoder is an LDPC decoder, after each incremental change is made to the estimated probability of non-standard errors, syndrome weights are checked and compared against a syndromes resulting from the previous decoding operation with a previous estimated probability of non-standard errors. If the syndrome weight shows that the decoding operation with the incremented probability of non-standard error is closer to convergence than the prior decoding operation, the estimated probability of non-standard errors is incremented in a same direction. Thus, if the estimated probability of non-standard errors was increased, a similar increase is made for a next decoding operation. If the syndrome weight shows that the decoding operation with the incremented probability of non-standard error is farther from convergence than the prior decoding operation, the estimated probability of non-standard errors is incremented in an opposite direction. Thus, if the estimated probability of non-standard errors was increased, a decrease in the estimated probability is made for the next decoding operation.

With reference to FIG. 3, one embodiment of a decoding system 300 is shown that is associated with modifying decoder operating mode based on an estimated probability of non-standard errors. Like decoding system 200 of FIG. 2, the apparatus 300 includes a channel detector 310 and an inner decoder 350. In some embodiments, the channel detector is a SOVA channel detector and/or the inner decoder is an WPC soft decoder. The decoding system 300 includes a mode modification logic 360 that uses lookup tables (LUT)s to modify LLR values output by the channel detector 310 prior to input to the inner decoder 350.

When the decoding system 300 enters retry mode, the mode modification logic 360 is triggered to select a first (A->B) lookup table associated with a given type of error (e.g., hard, severe). Each type of error has an associated LUT that maps LLR values that are based on a first (e.g., unknown) probability of non-standard errors to LLR values that are based on a second (e.g., higher) probability of non-standard errors associated with the type of error. The mode modification logic 360 then substitutes the mapped LLR value for the LLR value output by the channel detector 310. In this manner, the mode modification logic 360 causes the channel detector output 310 to operate in a different domain "B" with respect to the probability of non-standard errors initially assumed (e.g., domain A). The mode modification logic 360 may simulate channel detector 310 operation that assumes a relatively high probability of non-standard errors. The inner decoder 350 operates normally, but will calculate LLRs based on revised LLRs from the channel detector 310. The mode modification logic then uses a second (B→A) lookup table associated with the selected error type maps the output LLR from the inner decoder 350 back to domain A so that the channel detector 310 may operate normally. The second lookup table may be a "mirror image" of the first lookup table.

With reference to FIG. 4, one embodiment of a decoding system 400 is shown that is associated with modifying decoder operating mode based on an estimated probability of non-standard errors. Like decoding systems 200 and 300 in FIGS. 2 and 3, the decoding system 400 includes a channel detector 410 and an inner decoder 450. In some embodiments, the channel detector is a SOVA channel detector and/or the inner decoder is an LDPC soft decoder. The decoding system 400 includes a mode modification logic 460. The mode modification logic 460 applies scaling factors to LLRs to cause the channel detector 410 and the inner decoder 450 to operate in a mode that is based on an estimated probability of non-standard errors associated with a given error type.

When the decoding system 400 enters retry mode, the mode modification logic 460 is triggered to select a first scaling factor associated with a type of error (e.g., hard, severe). Each type of error has an associated scaling factor that appropriately scales LLR values that are based on a first (e.g., unknown) probability of non-standard errors to LLR values that are based on a second (e.g., higher) probability of non-standard errors associated with the type of error. The mode modification logic 460 then scales an LLR value (scale B) output by the channel detector 410. In this manner, the mode modification logic 460 causes the channel detector output 410 to operate in a different domain "B" with respect to the probability of non-standard errors initially assumed (e.g., domain A). The mode modification logic 460 simulates channel detector 410 operation that assumes a relatively high probability of non-standard errors. The inner decoder 450 operates normally, but will calculate LLRs based on revised LLRs from the channel detector 410. The mode modification logic then uses a second scaling factor (scale A) associated with the selected error type to scale the output LLR from the inner decoder 450 back to domain A so that the channel detector 410 may operate normally. The second scaling factor may be a "mirror image" of the first scaling factor.

With reference to FIG. 5, one embodiment of a decoding system 500 is shown that is associated with modifying decoder operating mode based on an estimated probability of non-standard errors. Like decoding systems 200, 300, and 400 in FIGS. 2, 3 and 4, the decoding system 400 includes a channel detector 510 and an inner decoder 550. In some embodiments, the channel detector is a SOVA channel detector and/or the inner decoder is an LDPC soft decoder. The decoding system 500 includes a mode modification logic 560. The mode modification logic 560 limits LLRs based on saturation values to cause the channel detector 510 and the inner decoder 550 to operate in a mode that is based on an estimated probability of non-standard errors associated with a given error type.

When the decoding system 500 enters retry mode, the mode modification logic 560 is triggered to select a saturation value associated with a type of error (e.g., hard, severe). Each type of error has an associated saturation value that appropriately limits LLR values that are based on a first (e.g., unknown) probability of non-standard errors to LLR values to reflect a second (e.g., higher) probability of non-standard errors associated with the type of error. The mode modification logic 560 then limits the LLR value output by the channel detector 510. In this manner, the mode modification logic 560 causes the channel detector output 510 to operate in a different domain "B" with respect to the probability of non-standard errors initially assumed (e.g., domain A). The mode modification logic 560 simulates channel detector 510 operation that assumes a relatively high probability of non-standard errors. The inner decoder 550 operates normally, but will calculate LLRs based on the revised LLRs from the channel detector 510. The mode modification logic then uses a second saturation value associated with the selected error type to limit the output LLR from the inner decoder 550 back to domain A so that the channel detector 510 may operate normally. The second saturation value may be a "mirror image" of the first saturation value.

In some embodiments, both the scaling technique of FIG. 4 and the saturation technique of FIG. 5 are used to translate between domain A (normal mode estimated probability of non-standard errors) to domain B (retry mode in which estimated probability of non-standard errors is based on a selected type of error).

Figure 6:
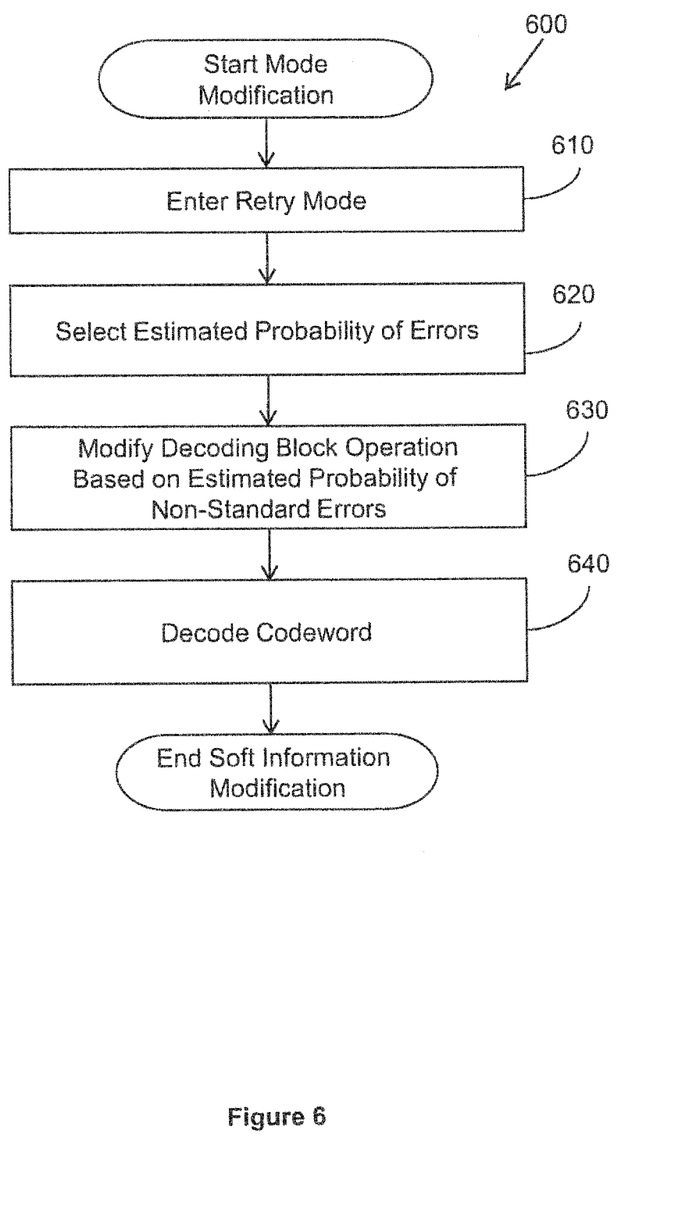
FIG. 6 illustrates one embodiment of a method associated with modifying detector operating mode based on an estimated probability of non-standard errors in concatenated decoding systems.

FIG. 6 illustrates one embodiment of a method 600 that is associated with modifying decoder operating mode based on an estimated probability of non-standard errors. At 610, the method includes entering retry mode. At 620, an estimated probability of non-standard errors is selected. The estimated probability of non-standard errors may be selected based on a type of error that may be occurring but is as yet undetected (e.g., hard errors, severe errors). At 630, the method includes, modifying operation of a decoding block to a second mode that is based on the selected probability of non-standard errors. At 640, the method includes decoding the codeword bits in the mode determined by the estimated probability of non-standard errors.

In one embodiment, the decoding codeword bits in the second mode is performed by receiving, from a first decoding block, an LLR value for a codeword bit based on the first estimated probability of non-standard errors. A lookup table is accessed that maps LLR values for the first mode to LLR values for the second mode. The LLR values for the second mode reflect the second estimated probability of non-standard errors and are different than the LLRs for the first mode. A second mode LLR value that is mapped to the calculated LLR value is selected. The selected second mode LLR is provided as an output of the first decoding block and an input to a second decoding block.

In one embodiment, decoding codeword bits in the second mode is performed by receiving, from a selected decoding block, an LLR value for a codeword bit based on the first estimated probability of non-standard errors and selecting a scaling factor that reflects the second estimated probability of non-standard errors. The scaling factor is applied to the LLR value to produce a scaled LLR value and provides as an output of the selected decoding block.

In one embodiment, decoding codeword bits in the second mode is performed by receiving, from a selected decoding block, an LLR value for a codeword bit based on the first estimated probability of non-standard errors and comparing the LLR value to a saturation value. When the LLR value has a magnitude that is more than the saturation value, the LLR value is modified to a value corresponding to the saturation value. The LLR value is provided as an output of the selected decoding block.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, instructions stored on a non-transitory medium or in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While examples of systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. An apparatus configured to decode a codeword comprising codeword bits, the apparatus comprising:
    first and second decoding blocks configured to:
        decode the codeword bits in a first mode in which a first set of LLRs is calculated based, at least in part, a first probability of non-standard errors for bits in the codeword; and
        decode the codeword bits in a second mode in which a second set of LLRS is calculated based on a second probability of non-standard errors for bits in the codeword;
    a mode modification logic configured to, when the first and second decoding blocks fail to decode the codeword bits in the first mode, cause a selected one of the first and second decoding blocks to decode the codeword bits in the second mode by:
        receiving, from the selected decoding block, a first LLR value for a codeword bit based on the first probability of non-standard errors;
        accessing a first lookup table that maps LLR values for the first mode to LLR values for the second mode, where the LLR values for the second mode reflect the second probability of non-standard errors and are different than the LLRs for the first mode;
        selecting a second LLR value that is mapped to the first LLR value; and
        providing the selected second LLR value as an output of the selected decoding block and an input to a non-selected decoding block.

2. The apparatus of claim 1, wherein at least one of the first and second decoding blocks comprises a channel detector.

3. The apparatus of claim 1, wherein at least one of the first and second decoding blocks comprises an LDPC decoder.

4. The apparatus of claim 1, wherein the mode modification logic is further configured to:
    receive, from the non-selected decoding block, a third LLR value for the codeword bit;
    access a second lookup table that maps the LLR values for the second mode to the LLR values for the first mode, where the LLR values for the first mode reflect the first probability of non-standard errors;
    select a fourth LLR value that is mapped to the third LLR value; and
    provide the selected fourth LLR value as an output of the non-selected decoding block and an input to the selected decoding block.

5. The apparatus of claim 1, wherein the mode modification logic is configured to select the lookup table by selecting a given lookup table associated with a given type of error from a plurality of lookup tables associated with a corresponding plurality of types of errors, wherein the given lookup table maps the LLR values for the first mode to the LLR values for the second mode for the given type of error.

6. The apparatus of claim 1, wherein the mode modification logic is configured to cause the selected one or both of the first and second decoding blocks to decode the codeword bits in a third mode based on a third probability of non-standard errors, where the third probability of non-standard errors is derived by incrementally increasing or decreasing the second probability of non-standard errors.

7. The apparatus of claim 6, wherein the mode modification logic is configured to, when decoding the codeword bits in the third mode fails to successfully decode the codeword:
    determine whether results of the decoding in the third mode is closer to a convergence criteria than results of the decoding in the second mode;
    when results of the decoding in the third mode are closer to the convergence criteria than results of the decoding in the second mode:
        determine whether the third probability is derived by incrementally increasing the second probability of non-standard errors or incrementally decreasing the second probability of non-standard errors, and
            when the third probability of non-standard errors is derived by incrementally increasing the second probability of non-standard errors, deriving a fourth probability of non-standard errors by incrementally increasing the third probability of non-standard errors;
            when the third probability of non-standard errors is derived by incrementally decreasing the second probability of non-standard errors, deriving a fourth probability of non-standard errors by incrementally decreasing the third probability of non-standard errors;
    when results of the decoding in the third mode are not closer to the convergence criteria than results of the decoding in the second mode:
        determine whether the third probability of non-standard errors is derived by incrementally increasing the second probability of non-standard errors or incrementally decreasing the second probability of non-standard errors, and
            when the third probability of non-standard errors is derived by incrementally increasing the second probability of non-standard errors, deriving a fourth probability of non-standard errors by incrementally decreasing the third probability of non-standard errors;
            when the third probability of non-standard errors is derived by incrementally decreasing the second probability of non-standard errors, deriving a fourth probability of non-standard errors by incrementally increasing the third probability of non-standard errors; and cause the decoding block to decode the codeword bits in a fourth mode based on the fourth probability of non-standard errors.

8. The apparatus of claim 1 wherein one or both of the first probability of non-standard errors and the second probability of non-standard errors is an estimated probability.

9. An apparatus configured to decode a codeword comprising codeword bits, the apparatus comprising:
first and second decoding blocks configured to:
decode the codeword bits in a first mode in which a first set of LLRs is calculated based, at least in part, a first probability of non-standard errors for bits in the codeword; and
decode the codeword bits in a second mode in which a second set of LLRS is calculated based on a second probability of non-standard errors for bits in the codeword;
a mode modification logic configured to, when the first and second decoding blocks fail to decode the codeword bits in the first mode, cause a selected one of the first and second decoding blocks to decode the codeword bits in the second mode by:
receiving, from the selected decoding block, an LLR value for a codeword bit based on the first probability of non-standard errors;
comparing the LLR value to a saturation value and when the LLR value has a magnitude that is more than the saturation value, modifying the LLR value to a value corresponding to the saturation value; and
providing the modified LLR value as an output of the selected decoding block.

10. A method, comprising:
decoding codeword bits from a codeword in a first mode determined by a first probability of non-standard errors; and
when decoding the codeword bits in the first mode fails to decode the codeword bits, decoding the codeword bits in a second mode determined by a second probability of non-standard errors by:
receiving, from a first decoding block, a first LLR value for a codeword bit based on the first probability of non-standard errors;
accessing a first lookup table that maps LLR values for the first mode to LLR values for the second mode, where the LLR values for the second mode reflect the second probability of non-standard errors and are different than the LLR values for the first mode;
selecting a second LLR value that is mapped to the first LLR value; and
providing the selected second LLR value as an output of the first decoding block and an input to a second decoding block.

11. The method of claim 10, further comprising:
receiving, from the second decoding block, a third LLR value for the codeword bit;
accessing a second lookup table that maps the LLR values for the second mode to the LLR values for the first mode;
selecting a fourth LLR value that is mapped to the third LLR value; and
providing the fourth value LLR as an output of the second decoding block and an input to the first decoding block.

12. The method of claim 10, further comprising selecting a lookup table associated with a given type of error from a plurality of lookup tables associated with a corresponding plurality of types of errors, wherein a given lookup table maps the LLR values for the first mode to the LLR values for the second mode for the given type of error.

13. The method of claim 10, wherein decoding the codeword bits in the second mode comprises:
when decoding the codeword bits in the second mode fails to successfully decode the codeword;
decoding the codeword bits in a third mode based on a third probability of non-standard errors, where the third probability of non-standard errors is derived by incrementally increasing or decreasing the second probability of non-standard errors.

14. The method of claim 13, further comprising:
when decoding the codeword bits in the third mode fails to successfully decode the codeword:
determining whether results of the decoding in the third mode is closer to a convergence criteria than results of the decoding in the second mode;
when results of the decoding in the third mode are closer to the convergence criteria than results of the decoding in the second mode:
determining whether the third probability is derived by incrementally increasing the second probability of non-standard errors or incrementally decreasing the second probability of non-standard errors, and
when the third probability of non-standard errors is derived by incrementally increasing the second probability of non-standard errors, deriving a fourth probability of non-standard errors by incrementally increasing the third probability of non-standard errors;
when the third probability of non-standard errors is derived by incrementally decreasing the second probability of non-standard errors, deriving a fourth probability of non-standard errors by incrementally decreasing the third probability of non-standard errors;
when results of the decoding in the third mode are not closer to the convergence criteria than results of the decoding in the second mode:
determining whether the third probability of non-standard errors is derived by incrementally increasing the second probability of non-standard errors or incrementally decreasing the second probability of non-standard errors, and
when the third probability of non-standard errors is derived by incrementally increasing the second probability of non-standard errors, deriving a fourth probability of non-standard errors by incrementally decreasing the third probability of non-standard errors;
when the third probability of non-standard errors is derived by incrementally decreasing the second probability of non-standard errors, deriving a fourth probability of non-standard errors by incrementally increasing the third probability of non-standard errors; and
decoding the codeword bits in a fourth mode based on the fourth probability of non-standard errors.

15. A method, comprising:
decoding codeword bits from a codeword in a first mode determined by a first probability of non-standard errors; and
when decoding the codeword bits in the first mode fails to decode the codeword bits, decoding the codeword bits in a second mode determined by a second probability of non-standard errors by:

receiving, from a selected decoding block, an LLR value for a codeword bit based on the first probability of non-standard errors;

comparing the LLR value to a saturation value and when the LLR value has a magnitude that is more than the saturation value, modifying the LLR value to a value corresponding to the saturation value; and providing the modified LLR value as an output of the selected decoding block.

16. A device comprising:

a memory device configured to store data encoded as codeword bits; and a decoder in communication with the memory device, comprising:

a channel detector configured to operate in a first mode determined by a first probability of non-standard errors to read a codeword bits from the memory device, to calculate first soft information based, at least in part on the first probability of non-standard errors, and to output the soft information;

an inner decoder configured to operate in a first mode determined by the first probability of non-standard errors to input the first soft information from the channel detector, to calculate second soft information based, at least in part on the first probability of non-standard errors, and to output the second soft information to specify probable values for codeword bits;

a mode modification logic configured to cause a selected one of the channel detector and the inner decoder to operate in a second mode in which soft information is calculated based, at least in part, on a second probability of non-standard errors when the decoder fails to decode the codeword bits in the first mode; and wherein the mode modification logic is configured to cause the selected one of the channel detector and the inner decoder to operate in the second mode by:

receiving, from the selected one of the channel detector and the inner decoder, a first soft information value for a codeword bit based on the first probability of non-standard errors;

accessing a first lookup table that maps soft information values for the first mode to soft information values for the second mode, where the soft information values for the second mode reflect the second probability of non-standard errors and are different than the soft information values for the first mode;

selecting a second soft information value that is mapped to the first soft information value; and     providing the selected second soft information value as an output of the selected decoding block and an input to a non-selected one of the channel detector and the inner decoder.

* * * * *